United States Patent
Abessolo Bidzo et al.

(10) Patent No.: US 12,439,702 B2
(45) Date of Patent: Oct. 7, 2025

(54) ELECTROSTATIC DISCHARGE PROTECTION FOR WIRELESS DEVICE

(71) Applicant: NXP B.V., Eindhoven (NL)

(72) Inventors: Dolphin Abessolo Bidzo, Nijmegen (NL); Erwin Janssen, Veldhoven (NL); Erwin Johannes Gerardus Janssen, Meijel (NL)

(73) Assignee: NXP B.V., Eindhoven (NL)

( * ) Notice: Subject to any disclaimer, the term of this patent is extended or adjusted under 35 U.S.C. 154(b) by 748 days.

(21) Appl. No.: 17/739,568

(22) Filed: May 9, 2022

(65) Prior Publication Data

US 2023/0361110 A1    Nov. 9, 2023

(51) Int. Cl.
  *H03F 1/52*    (2006.01)
  *H02H 9/04*    (2006.01)
  *H10D 89/60*   (2025.01)

(52) U.S. Cl.
  CPC .......... *H10D 89/911* (2025.01); *H02H 9/046* (2013.01); *H03F 1/523* (2013.01); *H10D 89/611* (2025.01); *H03F 2200/294* (2013.01)

(58) Field of Classification Search
  CPC .... H10D 89/911; H10D 89/611; H02H 9/046; H02H 9/04; H03F 1/523; H03F 2200/294; H03F 3/195; H03F 1/52; H03F 3/217; H03F 2200/78; H04B 1/40; H04B 1/1615; H03G 3/3042
  USPC .............................................. 330/207 P, 298
  See application file for complete search history.

(56) References Cited

U.S. PATENT DOCUMENTS

| | | | |
|---|---|---|---|
| 5,901,022 A | 5/1999 | Ker | |
| 6,437,407 B1 | 8/2002 | Ker et al. | |
| 6,771,475 B2 | 8/2004 | Leete | |
| 7,280,330 B2 | 10/2007 | Oguzman et al. | |
| 8,116,046 B2 | 2/2012 | Block et al. | |
| 8,482,888 B2 * | 7/2013 | Tsai | H02H 9/045 361/56 |
| 8,918,138 B2 | 12/2014 | Mikhemar et al. | |
| 9,929,698 B2 * | 3/2018 | Gudem | H03F 1/223 |

(Continued)

FOREIGN PATENT DOCUMENTS

| | | |
|---|---|---|
| CN | 112054815 B | 11/2021 |
| KR | 101006095 B1 | 1/2011 |

OTHER PUBLICATIONS

Ker, M., "ESD Protection Design for Giga-Hz RF CMOS LNA with Novel Impedance-Isolation Technique", Electrical Overstress/Electrostatic Discharge Symposium, IEEE, Sep. 21, 2003.

*Primary Examiner* — Khanh V Nguyen

(57) ABSTRACT

An electro-static discharge (ESD) protection system for a wireless transceiver comprises a switch circuit at a first terminal and a second terminal of a low noise amplifier; a primary ESD protection circuit between an input terminal and a low voltage supply terminal of the wireless transceiver for shunting a first source of current of an ESD event; a clamp element between a high voltage supply terminal and the low voltage supply terminal having a clamping voltage that is less than a breakdown voltage of the LNA for preventing a second source of current of the ESD event from receipt by the LNA; and a power supply ESD clamp element between the high voltage supply terminal and the low voltage supply terminal for shunting a third source of current of the ESD event at the high voltage supply terminal.

20 Claims, 7 Drawing Sheets

(56) References Cited

U.S. PATENT DOCUMENTS

2011/0286136 A1    11/2011  Tsai
2012/0176709 A1*  7/2012  Tsai ........................ H03F 3/193
                                                                29/825
2017/0288398 A1    10/2017  Worley et al.

* cited by examiner

ELECTROSTATIC DISCHARGE PROTECTION FOR WIRELESS DEVICE

FIELD

The present disclosure relates generally to electrostatic discharge (ESD) protection circuits, and more particularly to circuits for protecting input pins of wireless transceivers against ESD-related events.

BACKGROUND

Electrostatic Discharge (ESD) includes an undesirable electric current that flows between surfaces at different electrical potentials and may cause damage to integrated circuits. ESD can have a significant effect on a chip's reliability. Modern integrated circuits (ICs), for example, the input pins of radio frequency integrated circuits (RFICs) are vulnerable to ESD due to high frequency requirements.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Modern semiconductor fabrication techniques allow RFICs to operate in millimeter wave frequencies, typically using CMOS technology. In order to enable proper and safe operation of ICs, on-chip ESD protection circuits should be included. In a design of an RFIC, a critical point that requires ESD protection is at the RF front-end between the low noise amplifier (LNA) and antenna(s). The LNA, which is commonly the most sensitive element in the RF front end, is typically exposed to ESD sparks, or pulses, induced through the antenna pins, which may include a combination of supply, ground, and RF input pins or the like.

Conventional ESD protection techniques applicable for ICs may not be efficiently implemented in RFICs and in particular, RFICs for millimeter wave frequencies, because they introduce significant parasitic capacitance and resistance, thus degrading RF front-end performance. For example, at the high frequency (80 GHz) receiver (RX) input pins of the radar transceiver, RF performance is prone to degradation due to parasitic junction capacitance.

To overcome the foregoing problems with conventional transceivers, embodiments of disclosed herein include an ESD protection system comprising a combination of ESD switches in series with the LNA, a primary ESD protection circuit at the RX input pin of a transceiver such as a radar transceiver, and full charged-device model (CDM) clamp including a cascade grounded gate NMOS (ggNMOS) to supply and ground, which addresses the susceptibility of an electronic device to ESD to allow the RX pin to be more robust against ESD stresses. The full CDM clamp protects the input of the LNA via an inductor connected between an input pin susceptible to an ESD event and CDM clamp. The ESD switches are implemented in series to increase the breakdown voltage of the LNA MOS chain required for protection under ESD-like conditions. The primary ESD protection circuit is connected to a receive pin of the radar transceiver for the purpose of suppress the influence of parasitic effects by ESD devices of the ESD protection system including the non-linear junction capacitance on RF signal performance of the radar transceiver.

Figure 1:
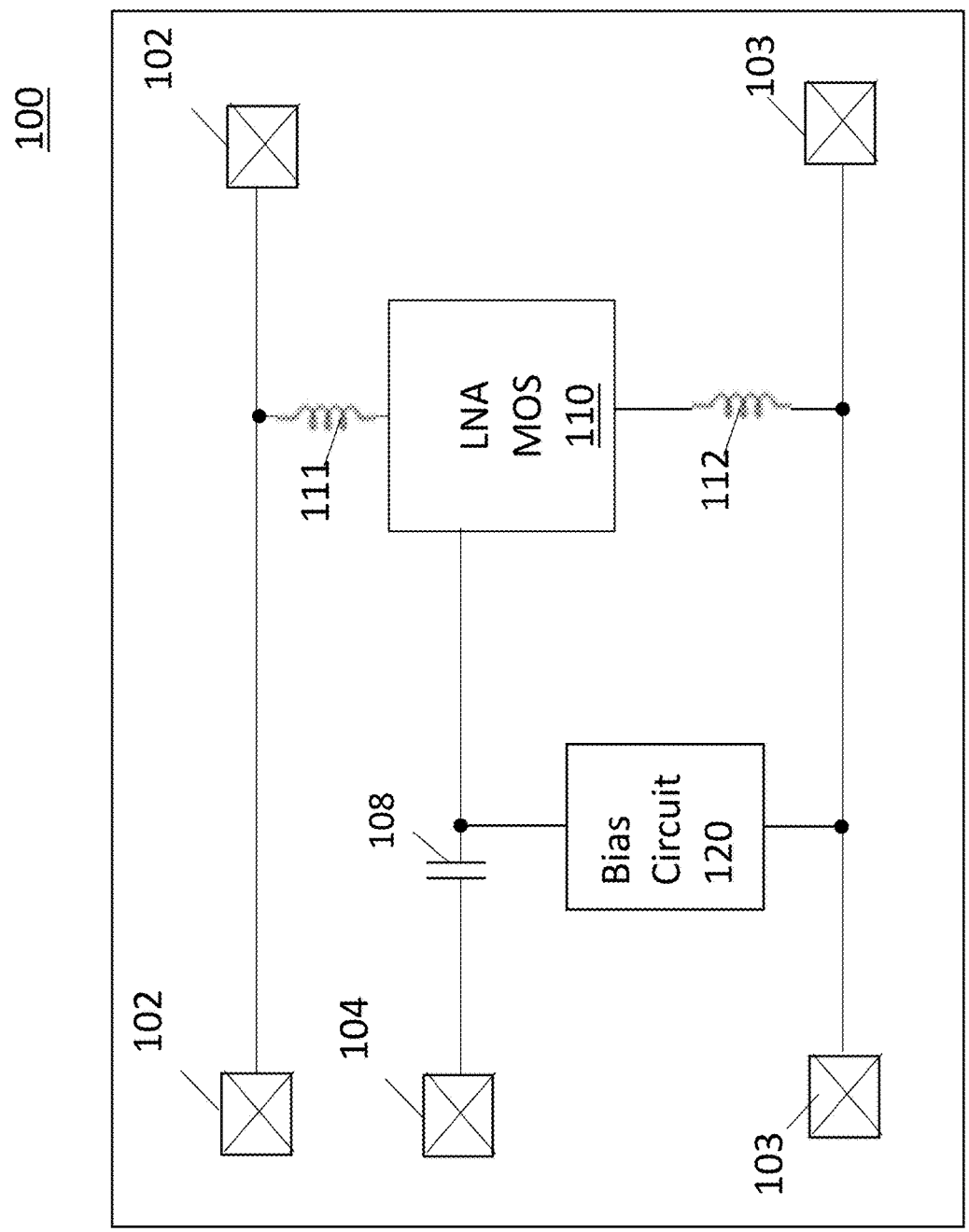
FIG. 1 is a schematic diagram of an input portion of a radar transceiver at which embodiments of the present inventive concepts can be applied.

FIG. 1 is a schematic diagram of a radar transceiver 100 at which embodiments of the present inventive concepts can be applied. Although a radar transceiver is described, the embodiments may equally apply to other types of wireless transceivers.

In some embodiments, the radar transceiver 100 comprises an LNA circuit 110 and a direct current (DC) bias circuit 120. As shown in FIG. 1, a particular embodiment includes an LNA circuit 110 coupled between two supply pins 102 and two ground pins 103, which in turn are in electrical communication with a voltage source and ground, respectively. Accordingly, the LNA circuit 110 may in some embodiments include a MOS transistor. As shown, the input of the LNA, e.g., the gate of the MOS transistor, may be coupled to a high-speed receiver (RX) input pin 104, for example, constructed and arranged to exchange a high frequency signal, for example, a millimeter wave signal of 80 GHz, but not limited thereto. A decoupling metal-oxide-metal (MOM) capacitor 108 may be between the RX input pin 104 and the LNA MOS circuit 110 for blocking DC voltages transmitted in the direction of the LNA MOS circuit 110.

The bias circuit 120 may be coupled between the RX input pin 104 and the input of the LNA circuit 110 for providing DC biasing functions. The bias circuit 120 can provide a DC biasing point for the LNA circuit 110 to mitigate an increase in undesirable noise. In some embodiments, the MOS transistor of the LNA circuit 110 may also have drain and source terminals connected to a high voltage or supply terminal 102 and a low voltage or ground terminal 103 with load 111 and degeneration 112 inductors, respectively.

Figure 2:
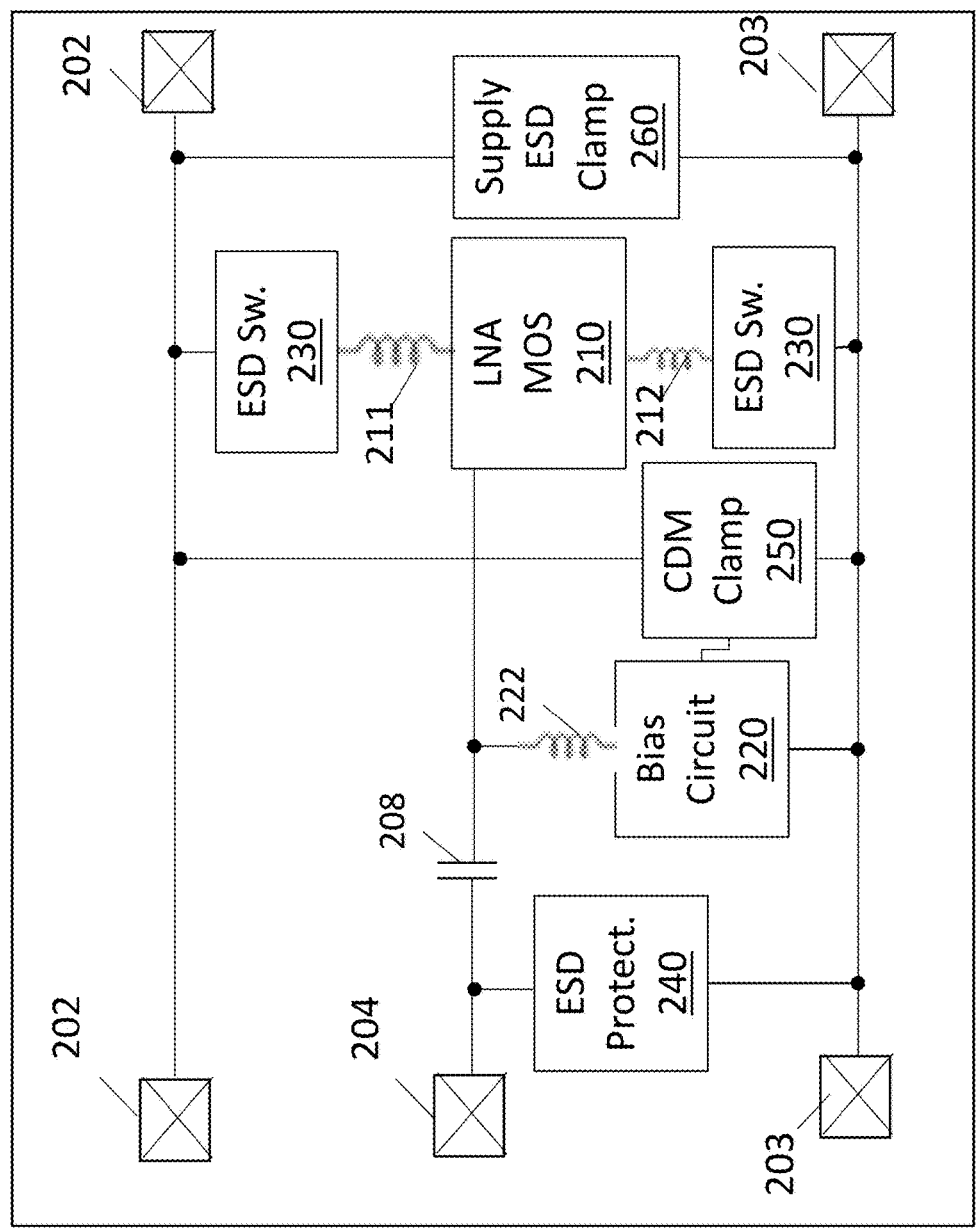
FIG. 2 is a block diagram of a radar transceiver including an electrostatic discharge (ESD) protection system, in accordance with some embodiments.

FIG. 2 is a block diagram of a radar transceiver 200 including an electrostatic discharge (ESD) protection system, in accordance with some embodiments. The ESD protection system includes some or all of an ESD switch circuit 230, a primary ESD protection circuit 240, a CDM clamp circuit 250, and a power-rail ESD clamp circuit 260.

The ESD switch circuit 230 may include a plurality of transistors or other switches at an LNA circuit 210, for example, the source and drain of the MOS transistor of a LNA circuit 210. The LNA circuit 210 may be similar to the LNA circuit 110 of FIG. 1 so details are not repeated for brevity. The ESD switch 230 is constructed and arranged to remain in a high impedance state during an electrical transient of an ESD event to increase the ESD breakdown voltage of the LNA 210, or more specifically, a gate oxide breakdown voltage. In doing so, a voltage of an ESD event can be directed away from the LNA 210 to the CDM clamp circuit 250 and/or power-rail ESD clamp circuit 260.

The primary ESD protection circuit 240 can be connected between the RX input pin 204 and a gate of a MOS transistor of the LNA 210 to provide a first line of defense against an ESD event by operating as a shunt and suppressing the influence of parasitic capacitance or nonlinear junction capacitance on the RF signal performance at the ESD protection circuit 240, which can otherwise cause performance degradation of the circuit. A decoupling metal-oxide-metal (MOM) capacitor 208 may be between the RX input pin 204 and the LNA 110 and can operate as a filter for a residual voltage that is not shunted by the ESD protection circuit 240, for example, blocking DC voltages to the LNA MOS circuit 110.

The CDM clamp circuit 250 can be connected to an inductor 222 of a bias circuit 220 and is triggered by a voltage received from the inductor 222 to activate the CDM clamp circuit 250 during an ESD event and to prevent an over-voltage condition from an ESD event at a control terminal, e.g., a gate, of the LNA 210.

The power-rail ESD clamp circuit 260 can provide a low-impedance path between the high voltage supply or VDD terminal 202 and the low voltage supply or VSS terminal 203 to discharge ESD current from a positive and negative ESD event on the transceiver terminals 202, 203, respectively. The power-rail ESD clamp circuit 260 coupled to the supply pin 202 and the ground pin 203 can reduce effects of a positive and negative ESD voltage on supply pin and the ground pin. The power-rail ESD clamp circuit 260 may include a field effect transistor (FET) for positive ESD strikes and an ESD diode 261 across it for negative ESD strikes.

Figure 3:
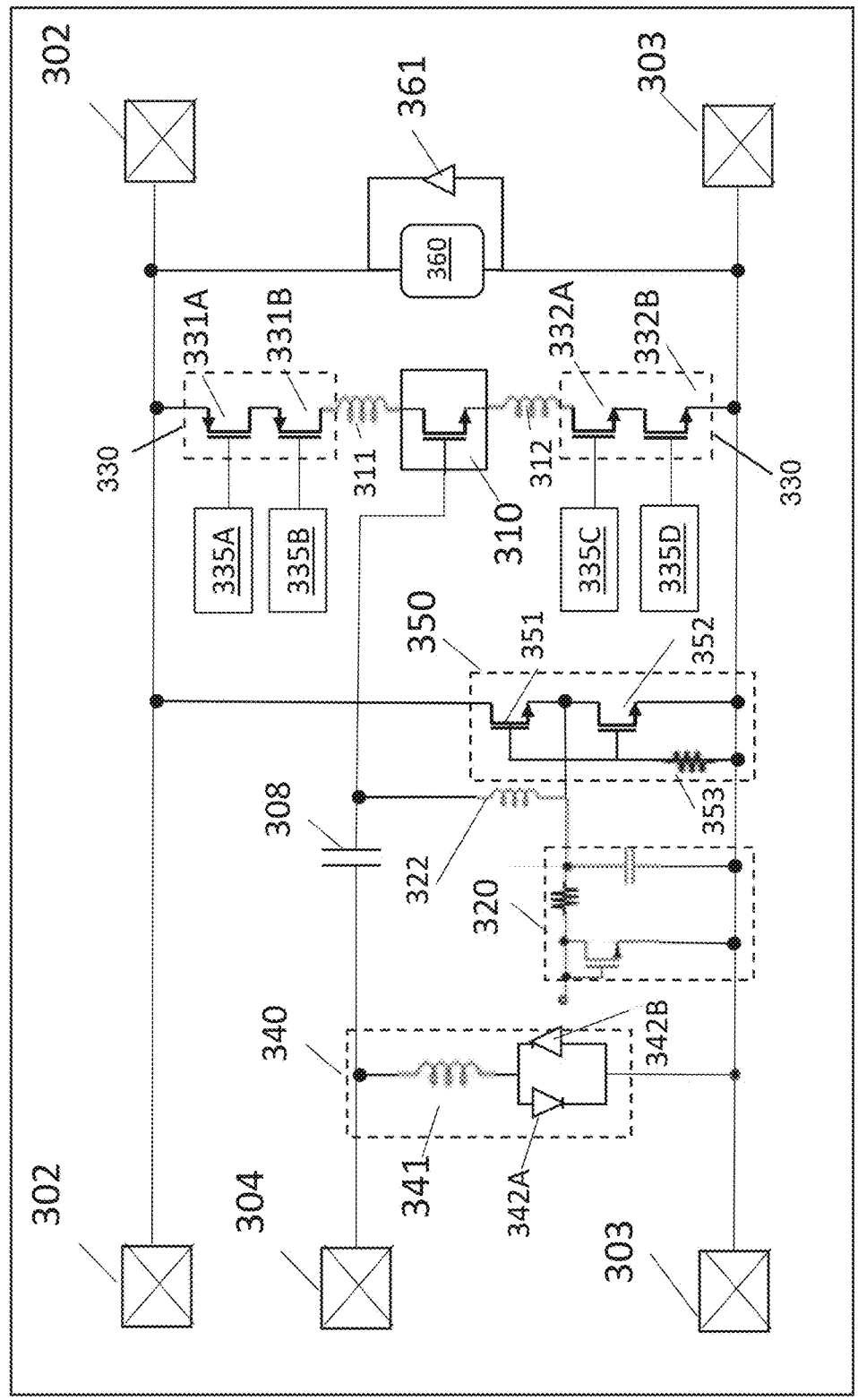
FIG. 3 is a schematic diagram of a radar transceiver, in accordance with some embodiments.

FIG. 3 is a schematic diagram of a radar transceiver 300, in accordance with some embodiments. In some embodiments, the electronic components illustrated and described in FIG. 3 may correspond to the various blocks described with respect to the ESD protection circuit of FIG. 2. In particular, a radar transceiver 300 may include an ESD switch circuit 330, a primary ESD protection circuit 340, a CDM clamp circuit 350, and a power-rail ESD clamp circuit 360, which may be similar to the ESD switch circuit 230, primary ESD protection circuit 240, CDM clamp circuit 250, and power-rail ESD clamp circuit 260 of FIG. 2.

In some embodiments, the ESD switch circuit 330 may include first and second PMOS transistors 331A, 331B (generally, 331) coupled in series to the LNA circuit 310, for example, a drain of a MOS transistor of the LNA circuit 310. The ESD switch circuit 330 may also include first and second NMOS transistors 332A, 332B (generally, 332) coupled in series to the LNA circuit 310, for example, a source of the LNA MOS transistor. Additional MOS transistors may be cascaded with the PMOS and NMOS transistors 331, 332, respectively, to increase an effective breakdown voltage of the LNA circuit 310 to be greater than a clamping voltage of the CDM clamp circuit 350 during an ESD event so that the CDM clamp circuit 350 and ESD switch circuit 330 can protect the LNA circuit 310.

In some embodiments, the gate of each MOS transistor 331, 332 is coupled to a control switch 335A-335D (generally, 335), which may include a resistor-capacitor (RC) circuit configured to generate an RC time constant in the ESD time domain, namely, to detect an electrical (dV/dt) transient of an ESD event and activate the ESD switch circuit 230 to remain in a non-conducting or high impedance state during an ESD event For example, during an ESD event such as an ESD zap at the transceiver pins, the RC circuit of the control switch 335 causes the voltage level at the RC circuit to increase significantly more slowly than the voltage produced on the supply pin 302, or high voltage supply terminal, because the RC circuit is configured to provide an RC time constant on the order of microseconds resulting in a delayed voltage increase. Therefore, the activation of the ESD switch circuit 230 can cause the ESD voltage to discharge through a combination of the CDM clamp circuit 350 and the power-rail ESD clamp circuit 360 due to the delay of voltage increase at the RC circuit.

After the ESD event, e.g., maximum holding time is about 1 microsecond, depending on the nature or type of the ESD event, the ESD switch circuit 330 is enabled in a normal operation mode. A load inductor 311 may be between the serially connected PMOS transistors 331 and the drain of the LNA MOS transistor 310. A degeneration inductor 312 may be between the serially connected NMOS transistors 332 and the source of the LNA MOS transistor 310. The load and degeneration inductors 311, 312 coupled to the drain and source terminals of the LNA MOS transistor 310 can minimize the impact of parasitic effects of the switch circuit 230 on the overall RF performance of the LNA.

Figure 4:
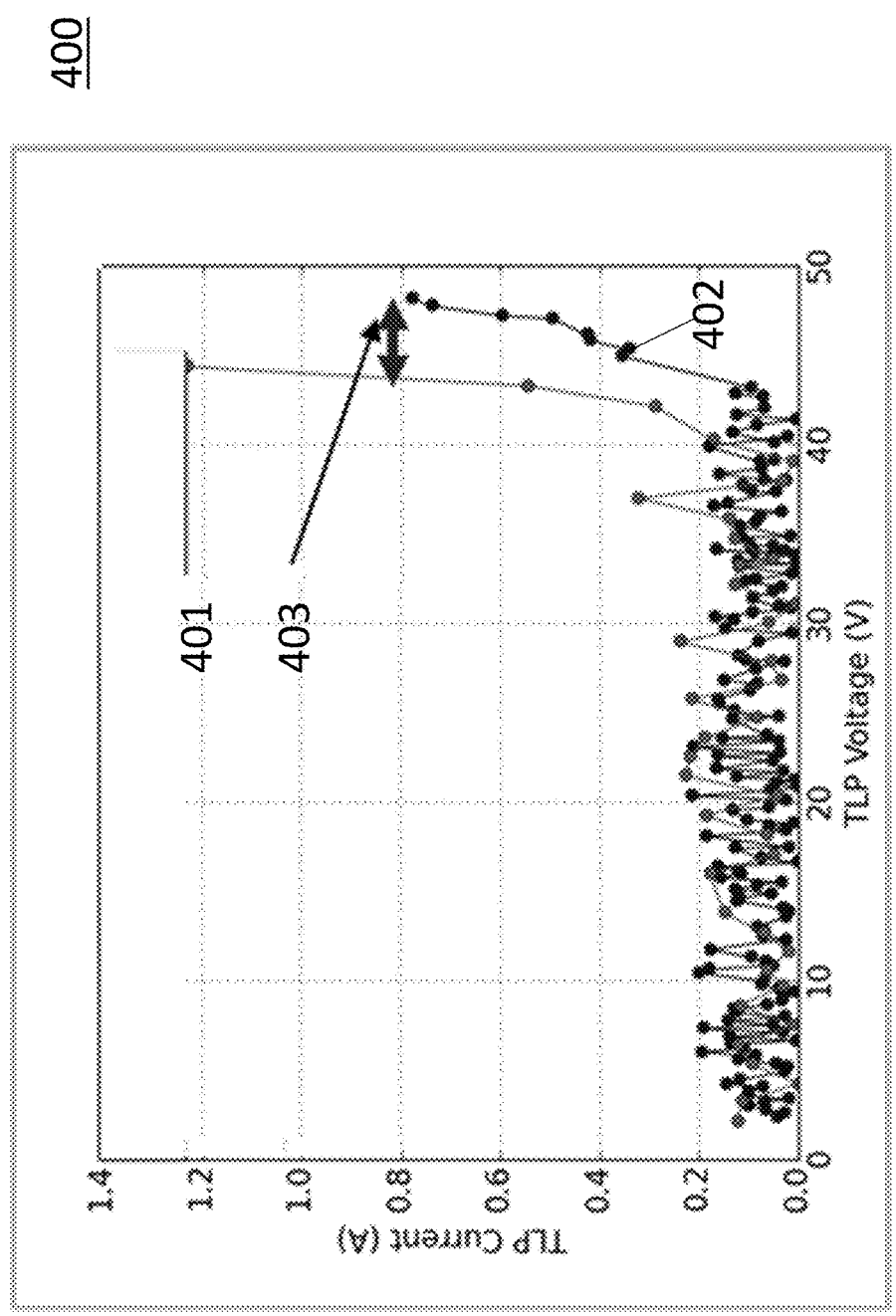
FIG. 4 is a graph illustrating comparative measurements of the LNA MOS circuit with and without the ESD switch circuit of FIG. 3.

In some embodiments, the overall breakdown voltage can be improved by more than 4V for a single ESD switch 331, 332, as shown in the ESD transmission line pulse (TLP) in the graph 400 of FIG. 4. In particular, a TLP currents of the LNA MOS chain alone 401 (no ESD switches) are compared to those of the LNA MOS chain with the cascaded ESD switches 402. For a stack of 2×ESD switches, the expectation in terms of gain in the overall BV 403 is about 8V. Note that depending on the technology node, additional ESD switches can be implemented in order to achieve even a higher ESD breakdown voltage 403 of the LNA MOS chain.

In some embodiments, the CDM clamp circuit 350 may include a cascade grounded gate NMOS (ggNMOS) circuit including a supply transistor 351 and ground transistor 352, for example MOS transistors. When the ggNMOS circuit is used as a clamp, a low holding voltage is helpful to sustain a much higher ESD current because it provides a smaller power dissipation. The supply transistor 351 may be coupled between a supply pin 302 and the ground transistor 352. The ground transistor 352 may be coupled between the supply transistor 351 and the ground pin 303. The full CDM clamp circuit 250 protects the input of the LNA 210 via an inductor 322. For reliability reasons, a gate resistor 353 may be implemented between the gates of the ggNMOS circuit transistors 351, 352 and ground pin 303. In some embodiments, the gate resistor 353 may have a resistance value of 500Ω but not limited thereto. A MOM capacitor 308 or the like may operate as a filter for residual voltages, for example, ESD-related voltages not shunted by the ESD protection circuit 340. This configuration permits the ggNMOS circuit transistors 351, 352 to trigger in response to a voltage received via the inductor 322 exceeds a threshold voltage of the transistors 351, 352, which in turn snapback to their holding voltage prior to exhibiting low ohmic behavior. The snapback behavior ensures that the CDM clamp circuit 350 has a low clamping voltage relative to the breakdown voltage imposed by the ESD switch circuit 330, thereby preventing the LNA 310 from ESD-related damage.

In some embodiments, the primary ESD protection 340 includes a pad inductor 341 having a low DC resistance in series with antiparallel ESD gated diodes 342A, 342B (generally, 342) connected to a high-speed RX input pin 304 via the pad inductor 341, or alternatively via a coplanar waveguide (CPW). The gated diodes 342 are used for their fast turn-on time and low voltage overshoot under very fast ESD transient circumstances, which can be beneficial for increasing the breakdown voltage and minimizing the impact of ESD device parasitic effects on the overall LNA RF performance. The high frequency (e.g., 80 GHz) and high-speed receiver RX pins of typical radar transceivers cannot afford either a direct primary ESD protection or direct local CDM clamp due to RF functional reasons. To overcome the risk of reduced RF performance due to the parasitic junction capacitance or the like of the ESD device of a radar transceiver, the ESD protections in some embodiments are connected to the RX input pin 304 and the LNA circuit 310 can be further protected by the pad inductor 341, for example, as shown.

In some embodiments, the transceiver's supply domain, e.g., electrical path from the supply pin 302 can be additionally protected from an ESD strike by the power-rail ESD clamp circuit 360. The ESD switch circuit 330 can prevent a discharge of ESD-related current to the LNA circuit 310 so that the current is only discharged via the low impedance path offered by the power-rail ESD clamp circuit 360. The power-rail ESD clamp circuit 360 may include a FET or the like for receiving and mitigating the effects of an undesirable ESD voltage. An ESD diode 361 may extend across the rail clamp 360 for receiving and mitigating the effects of a negative ESD voltage.

Figures 5A, 5B:
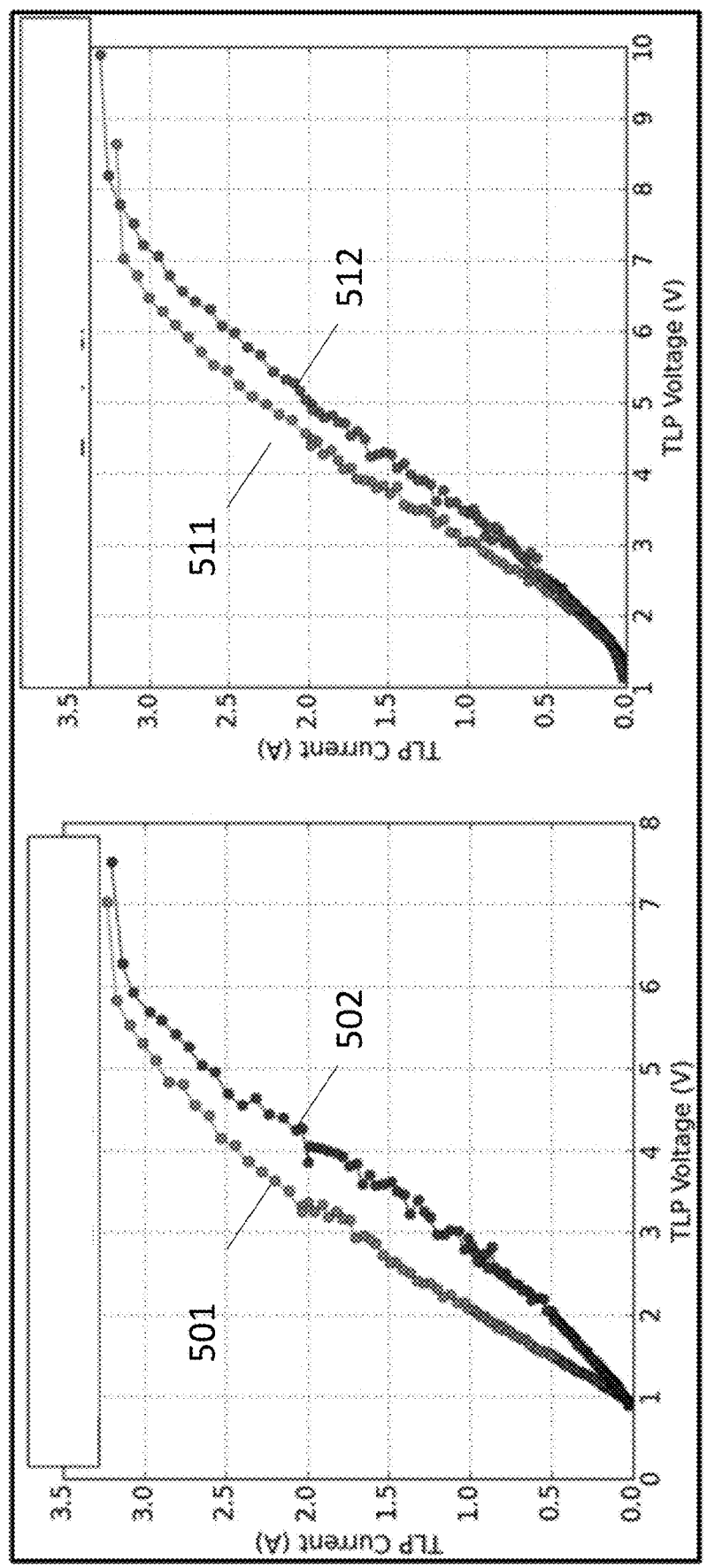
FIGS. 5A and 5B are graphs illustrating comparative results of ESD transmission line pulse (TLP) measurements performed on a receiver (RX) input terminal of the radar transceiver of FIGS. 2 and 5.

As shown in the graphs 500A, 500B of FIGS. 5A and 5B, respectively, the ESD TLP measurements performed on the RX pin 304 to evaluate the ESD robustness of the primary ESD protection circuit 340, for example, a failure current of 2-3 A corresponding to about 4.8 kV HBM in terms of peak current. Curves 501 and 502 of graph 500A illustrate an ESD TLP characterization with respect to a supply pin 302 or high voltage supply terminal. Curves 511 and 512 of graph 500B illustrate an ESD TLP characterization with respect to a ground pin 302 or low voltage supply terminal. For zaps to a ground pin 303, an ESD discharge path corresponds to gated diodes 342A and 342B. To address ESD zaps between supply pin 302 and input pin 304, the ESD discharge path corresponds to the gate diode 342A and the STI diode 361 coupled in parallel to the supply ESD clamp 360 (positive) and gate diode 342 and the supply clamp FET 360.

Figure 6B:
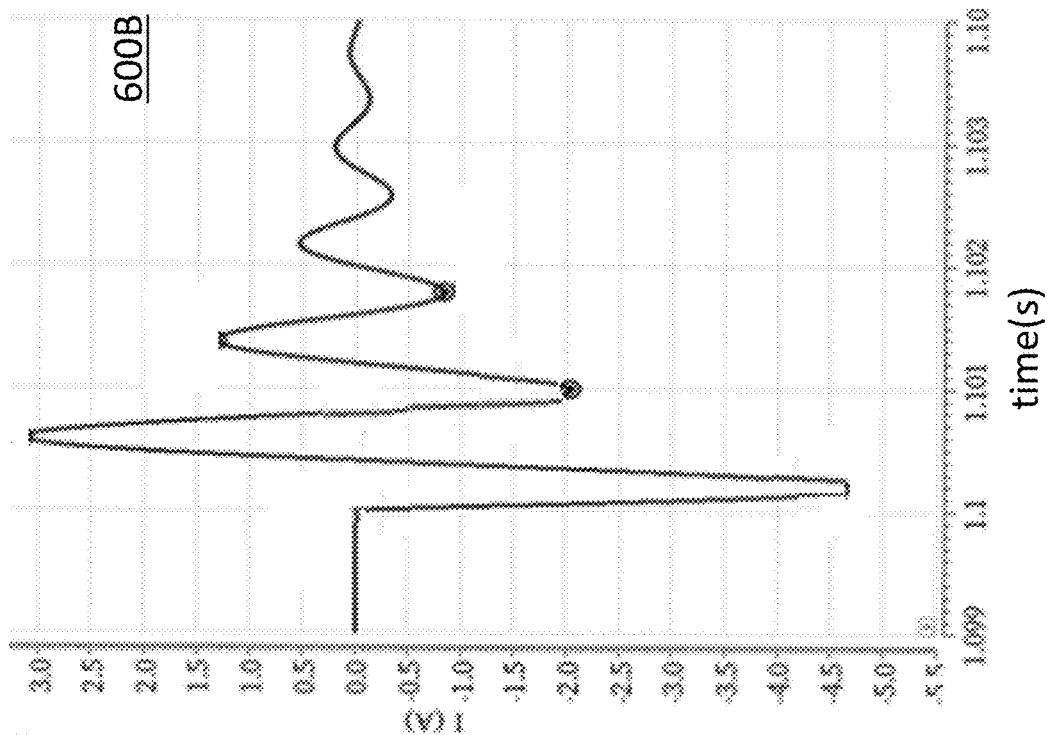
FIGS. 6A and 6B are graphs illustrating a comparison of charged-device model (CDM) waveforms of an integrated circuit (IC) package, in accordance with some embodiments.
Figure 6A:
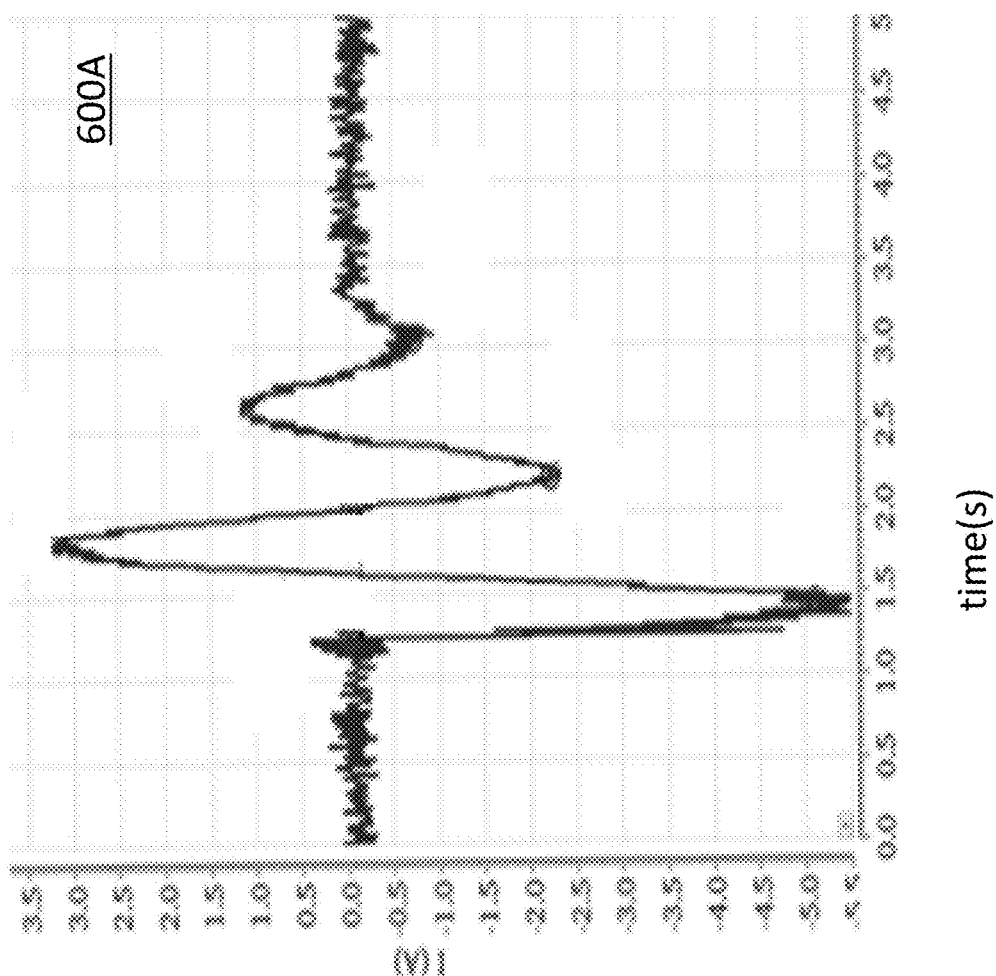
Figure 7A:
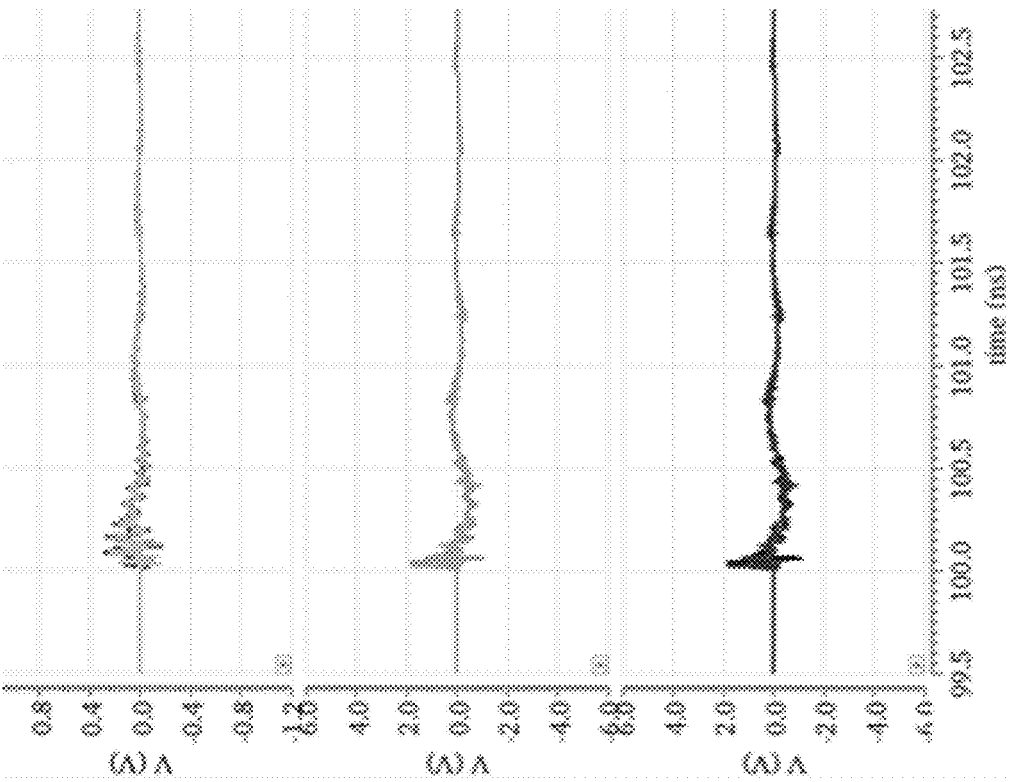
FIGS. 7A and 7B are graphs illustrating resulting voltages across the terminals of an LNA of a radar transceiver, in accordance with some embodiments.
Figure 7B:
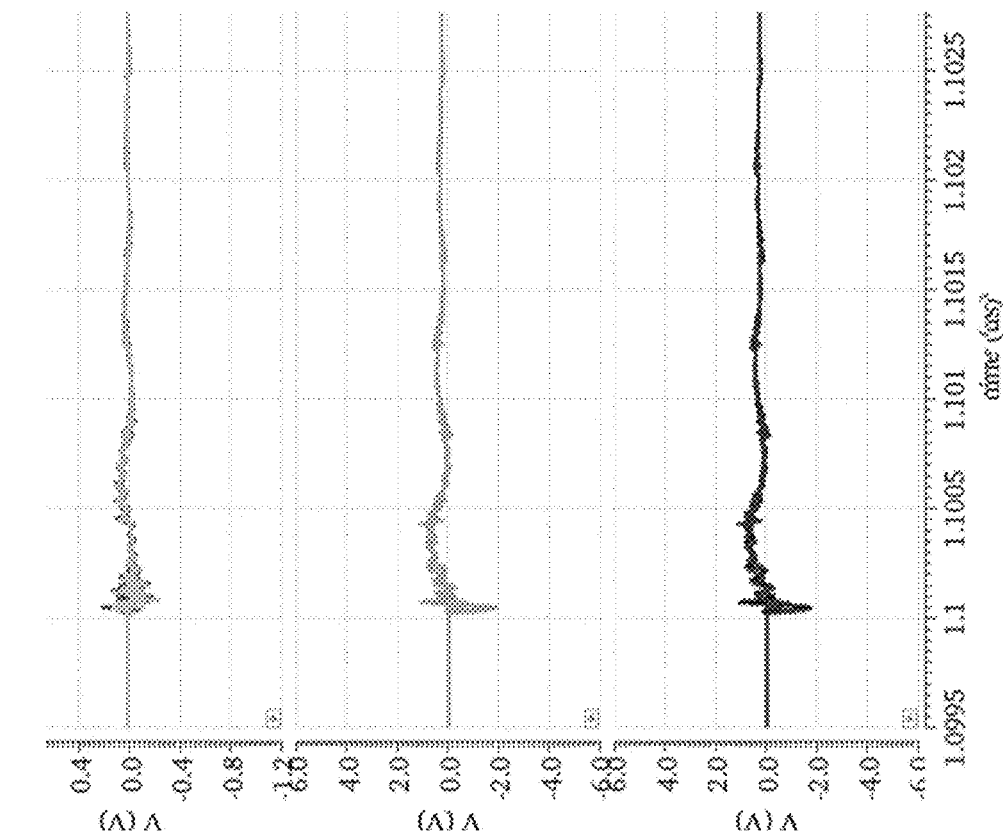

Graph 600A at FIG. 6A illustrates a CDM discharge waveform. Graph 600B of FIG. 6B illustrates a modeled CDM waveform. The CDM waveforms are extracted at 500V CDM from an IC package used to house the radar transceiver 200 of FIG. 2 or the radar transceiver 300 of FIG. 3. As shown the graphs 700A, 700B of FIGS. 7A and 7B, respectively, the resulting voltages across the LNA terminals are low, and less than the ESD breakdown voltages of transistors of the LNA 310. In particular, the graph 700A of FIG. 7A corresponds to the discharged waveforms at a 500V CDM shown in FIG. 6A and the graph 700B of FIG. 7B corresponds to the modeled waveform of FIG. 6B. This further illustrates that the overall ESD protection strategy implemented for the ground, supply, and receiver pins of the radar transceiver is suitable for effective CDM protection of the LNA 310 without degrading the RF functional performance of the radar transceiver 300.

As will be appreciated, at least some embodiments include the following embodiments. In one embodiment, a transceiver comprises a low noise amplifier (LNA) that boosts an input signal; a high voltage supply terminal in electrical communication with a first terminal of the LNA; a low voltage supply terminal in electrical communication with a second terminal of the LNA; a radio frequency (RF) input terminal in electrical communication with a control terminal of the LNA; an inductor of a bias circuit between the control terminal of the LNA and the low voltage supply terminal; and an electro-static discharge (ESD) protection system that protects the LNA from an ESD event at one or more of the high voltage supply terminal, the low voltage supply terminal, and the RF input terminal. The ESD protection system comprises: a primary ESD protection circuit between the RF input terminal and the low voltage supply terminal for shunting a current of the ESD event at the RF input terminal; a local CDM clamp element including a connector to the inductor, wherein the local CDM clamp element is activated by a voltage of the ESD event received from the inductor to prevent an over-voltage condition from the ESD event at the control terminal of the LNA by generating a clamping voltage that is less than a breakdown voltage of the LNA; and a power supply ESD clamp element between the high voltage supply terminal and the low voltage supply terminal for shunting a current of the ESD event at the high voltage supply terminal.

Alternative embodiments of the transceiver may include one of the following features, or any combination thereof.

The ESD protection system may further comprise an ESD switch circuit coupled between the first terminal of the LNA and the high voltage supply terminal and further coupled between the second terminal of the LNA and the low voltage supply terminal, the ESD switch circuit increasing the breakdown voltage.

The ESD protection system may further comprise a control switch circuit having a resistor-capacitor (RC) circuit configured to provide a time constant that detects an electrical transient of the ESD event and activates the ESD switch circuit to generate the breakdown voltage.

The transceiver may further comprise a load inductor between the ESD switch circuit and the first terminal of the LNA and a degeneration inductor coupled between the ESD switch circuit and the second terminal.

The ESD protection system may further comprise a first plurality of transistors in series with the LNA and the load inductor; and a second plurality of second transistors in series with the LNA and the degeneration inductor, the first and second transistors arranged so that the current of the ESD event at the high voltage supply terminal is discharged through the power supply ESD clamp element and the current of the ESD event at the RF input terminal is discharged through the local CDM clamp element.

The LNA may comprise a MOS transistor, the first terminal is a drain of the MOS transistor, the second terminal is a source of the MOS transistor, and the control terminal is a gate of the MOS transistor.

The ESD protection system may further comprise a pad inductor having a low DC resistance in series with antiparallel ESD gated diodes connected between the high voltage supply terminal and the RF input terminal.

An ESD discharge path may extend between the antiparallel ESD gated diodes of the primary ESD protection circuit and the power supply ESD clamp element in response to the ESD event.

The CDM clamp may include a cascade grounded gate NMOS circuit including a supply transistor and a ground transistor, wherein the supply transistor and the ground transistor are triggered by the voltage of the ESD event received from the inductor, and in response, generate the clamping voltage.

In another embodiment, an electro-static discharge (ESD) protection system comprises an ESD switch circuit at a first terminal and a second terminal of a low noise amplifier (LNA) of a wireless receiver; a primary ESD protection circuit between an input terminal and a low voltage supply terminal of the wireless receiver for shunting a first source of current of an ESD event; a local CDM clamp element between a high voltage supply terminal and the low voltage supply terminal of the wireless receiver, the local CDM clamp element having a clamping voltage that is less than a breakdown voltage of the LNA for preventing a second source of current of the ESD event from receipt by the LNA; and a power supply ESD clamp element between the high voltage supply terminal and the low voltage supply terminal for shunting a third source of current of the ESD event at the high voltage supply terminal.

Alternative embodiments of the ESD protection system may include one of the following features, or any combination thereof.

The ESD protection system may further comprise a control switch circuit having a resistor-capacitor (RC) circuit configured to provide a time constant that detects an electrical transient of the ESD event and activates the ESD switch circuit.

The ESD protection system may further comprise a load inductor between the ESD switch circuit and the first terminal of the LNA and a degeneration inductor coupled between the ESD switch circuit and the second terminal.

The ESD switch circuit may further comprise a first plurality of transistors in series with the LNA and the load inductor; and a second plurality of second transistors in series with the LNA and the degeneration inductor.

The primary ESD protection circuit may further comprise a pad inductor having a low DC resistance in series with antiparallel ESD gated diodes connected between the high voltage supply terminal and the RF input terminal.

An ESD discharge path may extend between the antiparallel ESD gated diodes of the primary ESD protection circuit and the power supply ESD clamp element in response to the ESD event.

The CDM clamp may comprise a cascade grounded gate NMOS circuit including a supply transistor and a ground transistor, wherein the supply transistor and the ground transistor are triggered by the voltage of the ESD event received from the inductor, and in response, generate the clamping voltage that is less than the breakdown voltage of the LNA.

In another embodiment, a transceiver comprises a low noise amplifier (LNA) that boosts an input signal received by the transceiver; an inductor of a bias circuit between the control terminal of the LNA and a low voltage supply terminal; and an electro-static discharge (ESD) protection system that protects the LNA from an ESD event. The ESD protection system comprises an ESD switch circuit at a first terminal and a second terminal of a low noise amplifier (LNA); a local CDM clamp element including a connector to the inductor, wherein the local CDM clamp element is activated by a voltage of the ESD event received from the inductor to prevent an over-voltage condition from the ESD event at a control terminal of the LNA by generating a clamping voltage that is less than the breakdown voltage of the LNA; and a power supply ESD clamp element in communication with the ESD switch circuit for shunting a current of a ESD event at the high voltage supply terminal of the transceiver.

Alternative embodiments of the transceiver may include one of the following features, or any combination thereof.

The transceiver may further comprise a primary ESD protection circuit between an RF input terminal and a low voltage supply terminal for shunting a current of the ESD event at the RF input terminal prior to the local CDM clamp element being activated.

The ESD protection system may further comprise a control switch circuit having a resistor-capacitor (RC) circuit configured to provide a time constant that detects an electrical transient of the ESD event and activates the ESD switch circuit to generate the breakdown voltage.

The CDM clamp may include a cascade grounded gate NMOS circuit including a supply transistor and a ground transistor. The supply transistor and the ground transistor may be triggered by the voltage of the ESD event received from the inductor, and in response, generate the clamping voltage that is less than the breakdown voltage of the LNA.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A transceiver, comprising:
  a low noise amplifier (LNA) that boosts an input signal;
  a high voltage supply terminal in electrical communication with a first terminal of the LNA;
  a low voltage supply terminal in electrical communication with a second terminal of the LNA;
  a radio frequency (RF) input terminal in electrical communication with a control terminal of the LNA;
  an inductor of a bias circuit between the control terminal of the LNA and the low voltage supply terminal; and
  an electro-static discharge (ESD) protection system that protects the LNA from an ESD event at one or more of the high voltage supply terminal, the low voltage supply terminal, and the RF input terminal, the ESD protection system comprising:
    a primary ESD protection circuit between the RF input terminal and the low voltage supply terminal for shunting a current of the ESD event at the RF input terminal;
    a local CDM clamp element including a connector to the inductor, wherein the local CDM clamp element is activated by a voltage of the ESD event received from the inductor to prevent an over-voltage condition from the ESD event at the control terminal of the LNA by generating a clamping voltage that is less than a breakdown voltage of the LNA;
    a power supply ESD clamp element between the high voltage supply terminal and the low voltage supply terminal for shunting a current of the ESD event at the high voltage supply terminal; and
    a pad inductor having a low DC resistance in series with antiparallel ESD gated diodes connected to the RF input terminal.

2. A transceiver, comprising:
a low noise amplifier (LNA) that boosts an input signal;
a high voltage supply terminal in electrical communication with a first terminal of the LNA;
a low voltage supply terminal in electrical communication with a second terminal of the LNA;
a radio frequency (RF) input terminal in electrical communication with a control terminal of the LNA;
an inductor of a bias circuit between the control terminal of the LNA and the low voltage supply terminal; and
an electro-static discharge (ESD) protection system that protects the LNA from an ESD event at one or more of the high voltage supply terminal, the low voltage supply terminal, and the RF input terminal, the ESD protection system comprising:
a primary ESD protection circuit between the RF input terminal and the low voltage supply terminal for shunting a current of the ESD event at the RF input terminal;
a local CDM clamp element including a connector to the inductor, wherein the local CDM clamp element is activated by a voltage of the ESD event received from the inductor to prevent an over-voltage condition from the ESD event at the control terminal of the LNA by generating a clamping voltage that is less than a breakdown voltage of the LNA;
a power supply ESD clamp element between the high voltage supply terminal and the low voltage supply terminal for shunting a current of the ESD event at the high voltage supply terminal; and
an ESD switch circuit coupled between the first terminal of the LNA and the high voltage supply terminal and further coupled between the second terminal of the LNA and the low voltage supply terminal, the ESD switch circuit increasing the breakdown voltage.

3. The transceiver of claim 2, wherein the ESD protection system further comprises a control switch circuit having a resistor-capacitor (RC) circuit configured to provide a time constant that detects an electrical transient of the ESD event and activates the ESD switch circuit to remain in a high impedance state to increase the breakdown voltage.

4. The transceiver of claim 2, further comprising a load inductor between the ESD switch circuit and the first terminal of the LNA and a degeneration inductor coupled between the ESD switch circuit and the second terminal.

5. The transceiver of claim 4, wherein the ESD switch circuit comprises:
a first plurality of transistors in series with the LNA and the load inductor; and
a second plurality of second transistors in series with the LNA and the degeneration inductor, the first and second transistors arranged so that the current of the ESD event at the high voltage supply terminal is discharged through the power supply ESD clamp element and the current of the ESD event at the RF input terminal is discharged through the local CDM clamp element.

6. The transceiver of claim 1, wherein the LNA includes a MOS transistor, the first terminal is a drain of the MOS transistor, the second terminal is a source of the MOS transistor, and the control terminal is a gate of the MOS transistor.

7. The transceiver of claim 1, wherein
the pad inductor in series with antiparallel ESD gated diodes is connected between the RF input terminal and the low voltage supply terminal.

8. The transceiver of claim 7, wherein an ESD discharge path extends between the antiparallel ESD gated diodes of the primary ESD protection circuit and the power supply ESD clamp element in response to the ESD event.

9. A transceiver, comprising:
a low noise amplifier (LNA) that boosts an input signal;
a high voltage supply terminal in electrical communication with a first terminal of the LNA;
a low voltage supply terminal in electrical communication with a second terminal of the LNA;
a radio frequency (RF) input terminal in electrical communication with a control terminal of the LNA;
an inductor of a bias circuit between the control terminal of the LNA and the low voltage supply terminal; and
an electro-static discharge (ESD) protection system that protects the LNA from an ESD event at one or more of the high voltage supply terminal, the low voltage supply terminal, and the RF input terminal, the ESD protection system comprising:
a primary ESD protection circuit between the RF input terminal and the low voltage supply terminal for shunting a current of the ESD event at the RF input terminal;
a local CDM clamp element including a connector to the inductor, wherein the local CDM clamp element is activated by a voltage of the ESD event received from the inductor to prevent an over-voltage condition from the ESD event at the control terminal of the LNA by generating a clamping voltage that is less than a breakdown voltage of the LNA; and
a power supply ESD clamp element between the high voltage supply terminal and the low voltage supply terminal for shunting a current of the ESD event at the high voltage supply terminal,
wherein the local CDM clamp includes a cascade grounded gate NMOS circuit including a supply transistor and a ground transistor, wherein the supply transistor and the ground transistor are triggered by the voltage of the ESD event received from the inductor, and in response, generate the clamping voltage.

10. An electro-static discharge (ESD) protection system, comprising:
an ESD switch circuit at a first terminal and a second terminal of a low noise amplifier (LNA) of a wireless receiver;
a primary ESD protection circuit between an input terminal and a low voltage supply terminal of the wireless receiver for shunting a first source of current of an ESD event;
a local CDM clamp element between a high voltage supply terminal and the low voltage supply terminal of the wireless receiver, the local CDM clamp element having a clamping voltage that is less than a breakdown voltage of the LNA for preventing a second source of current of the ESD event from receipt by the LNA; and
a power supply ESD clamp element between the high voltage supply terminal and the low voltage supply terminal for shunting a third source of current of the ESD event at the high voltage supply terminal.

11. The ESD protection system of claim 10, wherein the ESD protection system further comprises a control switch circuit having a resistor-capacitor (RC) circuit configured to provide a time constant that detects an electrical transient of the ESD event and activates the ESD switch circuit.

12. The ESD protection system of claim 10, further comprising a load inductor between the ESD switch circuit and the first terminal of the LNA and a degeneration inductor coupled between the ESD switch circuit and the second terminal.

13. The ESD protection system of claim 12, wherein the ESD switch circuit comprises:
   a first plurality of transistors in series with the LNA and the load inductor; and
   a second plurality of second transistors in series with the LNA and the degeneration inductor.

14. The ESD protection system of claim 10, wherein the primary ESD protection circuit comprises
   a pad inductor having a low DC resistance in series with antiparallel ESD gated diodes connected to the RF input terminal.

15. The ESD protection system of claim 14, wherein an ESD discharge path extends between the antiparallel ESD gated diodes of the primary ESD protection circuit and the power supply ESD clamp element in response to the ESD event.

16. The ESD protection system of claim 10, wherein the local CDM clamp includes a cascade grounded gate NMOS circuit including a supply transistor and a ground transistor, wherein the supply transistor and the ground transistor are triggered by the voltage of the ESD event received from the inductor, and in response, generate the clamping voltage that is less than the breakdown voltage of the LNA.

17. A transceiver, comprising:
   a low noise amplifier (LNA) that boosts an input signal received by the transceiver;
   an inductor of a bias circuit between the control terminal of the LNA and a low voltage supply terminal; and
   an electro-static discharge (ESD) protection system that protects the LNA from an ESD event, the ESD protection system comprising:
      an ESD switch circuit at a first terminal and a second terminal of a low noise amplifier (LNA);
      a local CDM clamp element including a connector to the inductor, wherein the local CDM clamp element is activated by a voltage of the ESD event received from the inductor to prevent an over-voltage condition from the ESD event at a control terminal of the LNA by generating a clamping voltage that is less than the breakdown voltage of the LNA; and
      a power supply ESD clamp element in communication with the ESD switch circuit for shunting a current of an ESD event at the high voltage supply terminal of the transceiver.

18. The transceiver of claim 17, further comprising a primary ESD protection circuit between an RF input terminal and a low voltage supply terminal for shunting a current of the ESD event at the RF input terminal prior to the local CDM clamp element being activated.

19. The transceiver of claim 17, wherein the ESD protection system further comprises a control switch circuit having a resistor-capacitor (RC) circuit configured to provide a time constant that detects an electrical transient of the ESD event and activates the ESD switch circuit to remain in a high impedance state to increase the breakdown voltage.

20. The transceiver of claim 17, wherein the local CDM clamp includes a cascade grounded gate NMOS circuit including a supply transistor and a ground transistor, wherein the supply transistor and the ground transistor are triggered by the voltage of the ESD event received from the inductor, and in response, generate the clamping voltage that is less than the breakdown voltage of the LNA.

* * * * *